(12) United States Patent
Yang et al.

(10) Patent No.: US 11,398,261 B2
(45) Date of Patent: Jul. 26, 2022

(54) METHOD AND SIGNAL GENERATOR FOR CONTROLLING TIMING OF SIGNAL IN MEMORY DEVICE

(71) Applicants: TAIWAN SEMICONDUCTOR MANUFACTURING COMPANY, LTD., Hsinchu (TW); TSMC NANJING COMPANY LIMITED, Nanjing (CN); TSMC CHINA COMPANY LIMITED, Shanghai (CN)

(72) Inventors: Xiu-Li Yang, Shanghai (CN); He-Zhou Wan, Shanghai (CN); Mu-Yang Ye, Nanjing (CN); Lu-Ping Kong, Nanjing (CN); Ming-Hung Chang, Tainan (TW)

(73) Assignees: TAIWAN SEMICONDUCTOR MANUFACTURING COMPANY, LTD., Hsinchu (TW); TSMC NANJING COMPANY LIMITED, Nanjing (CN); TSMC CHINA COMPANY LIMITED, Shanghai (CN)

(*) Notice: Subject to any disclaimer, the term of this patent is extended or adjusted under 35 U.S.C. 154(b) by 0 days.

(21) Appl. No.: 17/157,746

(22) Filed: Jan. 25, 2021

(65) Prior Publication Data
US 2022/0165315 A1 May 26, 2022

(30) Foreign Application Priority Data
Nov. 20, 2020 (CN) .......................... 202011311624.7

(51) Int. Cl.
*G11C 7/00* (2006.01)
*G11C 7/12* (2006.01)
*G11C 7/10* (2006.01)
*G11C 7/22* (2006.01)

(52) U.S. Cl.
CPC .............. *G11C 7/12* (2013.01); *G11C 7/1069* (2013.01); *G11C 7/1096* (2013.01); *G11C 7/222* (2013.01); *G11C 2207/12* (2013.01)

(58) Field of Classification Search
CPC ....................................................... G11C 7/12
USPC ........................................................ 365/203
See application file for complete search history.

(56) References Cited

U.S. PATENT DOCUMENTS

2019/0147955 A1* 5/2019 Chen ..................... G11C 16/10
365/185.23

* cited by examiner

*Primary Examiner* — Hoai V Ho
(74) *Attorney, Agent, or Firm* — Maschoff Brennan

(57) ABSTRACT

A device includes a memory array, bit line pairs, word lines, a modulation circuit and a control signal generator. The memory array has bit cells arranged in rows and columns. Each bit line pair is connected to a respective column of bit cells. Each word line is connected to a respective row of bit cells. The modulation circuit is coupled with at least one bit line pair. The control signal generator is coupled with the modulation circuit. The control signal generator includes a tracking wiring with a tracking length positively correlated with a depth distance of the word lines. The control signal generator is configured to produce a control signal, switching to a first voltage level for a first time duration in reference with the tracking length, for controlling the modulation circuit. A method of controlling aforesaid device is also disclosed.

20 Claims, 8 Drawing Sheets

METHOD AND SIGNAL GENERATOR FOR CONTROLLING TIMING OF SIGNAL IN MEMORY DEVICE

CROSS-REFERENCE TO RELATED APPLICATION

This application claims priority to China Application Serial Number 202011311624.7, filed Nov. 20, 2020, which is herein incorporated by reference.

BACKGROUND

Electronic equipment and electronic-based systems require some form of high-speed memory devices for storing and retrieving information. Random access memories (RAM) are commonly used in integrated circuits. Embedded RAM is particularly popular in high speed communication, image processing and system-on-chip (SOC) applications. A RAM incorporates an array of individual bit cells. A user may execute both read and write operations on the bit cells of a RAM.

RAM is generally organized within the system into addressable blocks, each containing a predetermined number of bit cells. Each bit cell within a RAM represents a bit of information. The bit cells are organized into rows and columns. Each row of bit cells forms a word. Each bit cell within a row is coupled to the same word line which is used to activate the bit cells within the row. The bit cells within each column of memory are also each coupled to a pair of bitlines. These bitlines are also coupled to local input/output (LIO) lines. These local input/output lines are used to read data from an activated memory array or write data to an activated memory array. A bit cell is therefore accessed by activating the appropriate wordline and pair of bitlines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
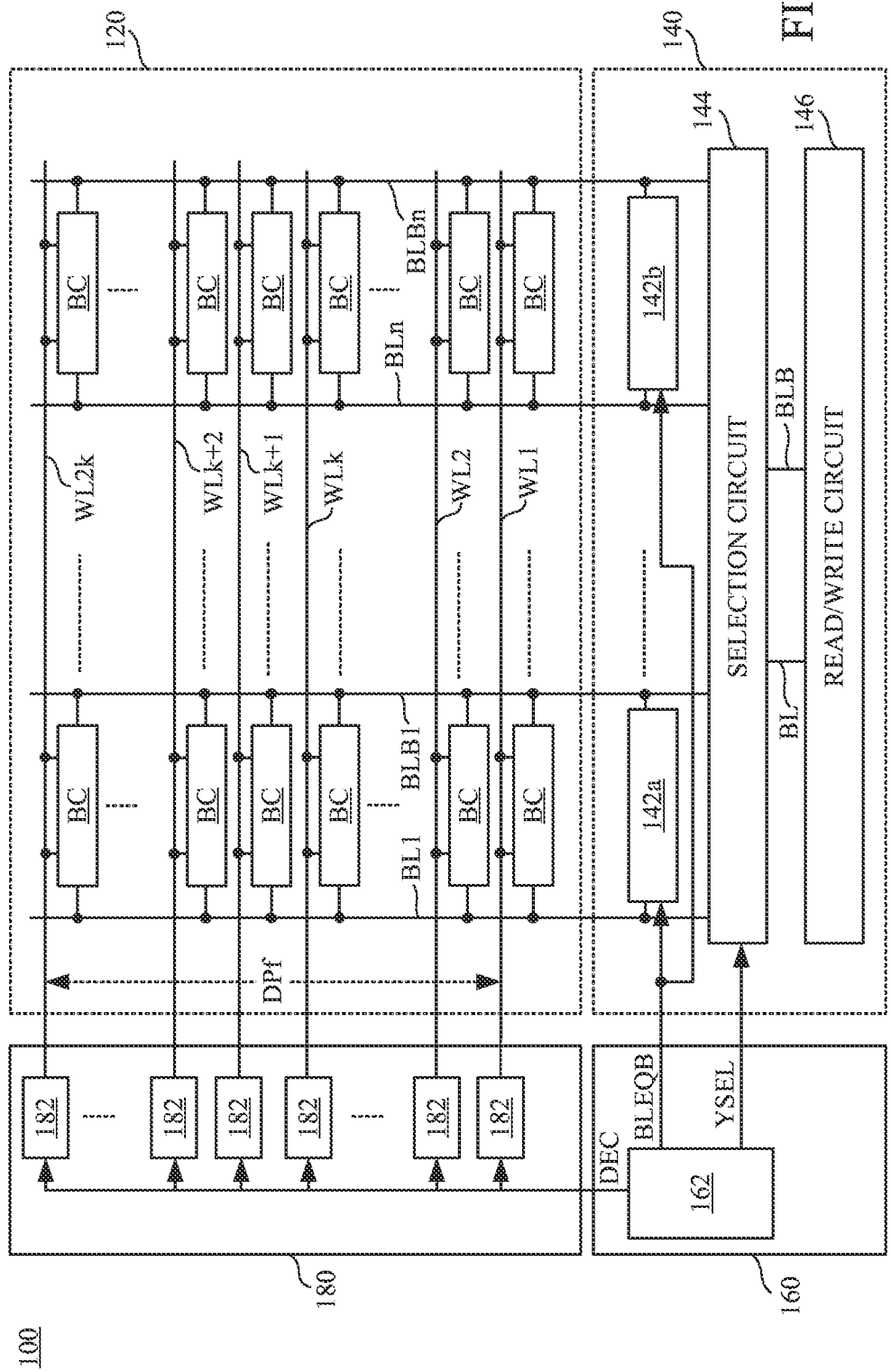
FIG. 1 is a schematic diagram illustrating a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

FIG. 1 is a schematic diagram illustrating a memory device 100 in accordance with various embodiments of the present disclosure. In embodiments illustratively shown in FIG. 1, the memory device 100 includes a memory array 120 including several bit cells BC arranged on multiple rows and columns. As shown in the memory array 120, these bit cells BC on the same column are connected to one bit line pair. For example, the bit cells BC on the 1$^{st}$ column on the left are connected to one bit line pair, which includes one bit line BL1 and one complement bit line BLB1, and the bit cells BC on the n$^{th}$ column on the right side are connected to another bit line pair, which includes another bit line BLn and another complement bit line BLBn. In some embodiments, n is a positive integer. For example, n can be about 8, 16, 32 or other suitable numbers. For brevity, only two columns of the memory array 120 are illustrated in FIG. 1 for demonstrational purpose. However, the embodiments of the disclosure are not limited to a specific amount of columns in the memory array 120.

As illustratively shown in FIG. 1, in some embodiments, the bit cells BC on the same row are connected to the same word line. For example, the bit cells BC on the 1$^{st}$ row (started from the bottom side of the memory array 120) are connected to the word line WL1; the bit cells BC on the k$^{th}$ row are connected to the word line WLk; the bit cells BC on the k+1$^{th}$ row are connected to the word line WLk+1; the bit cells BC on the k+2$^{th}$ row are connected to the word line WLk+2; and, the bit cells BC on the 2k row are connected to the word line WL2k. In some embodiments, k is a positive integer. For example, in the memory array 120 with 2048 rows of bit cells BC, k is equal to 1024 and there are 2048 word lines distributed from the bottom side to the top side of the memory array 120.

As illustratively shown in FIG. 1, in some embodiments, the memory device 100 includes a local input/output circuit 140, a main control circuit 160 and a word line decoder 180. The main control circuit 160 is coupled with the local input/output (LIO) circuit 140 and the word line decoder 180.

In some embodiments, the main control circuit 160 includes a control signal generator 162, and the control signal generator 162 is configured to generate some control signals to control/activate/deactivate functions in the local input/output circuit 140 and the word line decoder 180. As illustratively shown in FIG. 1, in some embodiments, the control signal generator 162 is configured to generate a control signal BLEQB for precharging and equalization to the local input/output circuit 140, a selection signal YSEL for column selection to the local input/output circuit 140, and still another control signal DEC to the word line decoder 180. In some other embodiments, the control signal generator 162 is able to generate other control signals for controlling other functions. The embodiments of the disclosure are not limited to these control signals.

In some embodiments, the local input/output circuit 140 includes modulation circuits 142a~142b, a selection circuit 144 and a read/write circuit 146. During a write operation, the read/write circuit 146 is configured to generate a write signal and a complement write signal onto a bit line pair, which includes a bit line BL and a complement bit line BLB in the local input/output circuit 140, and the selection circuit 144 is configured to couple the bit line pair (i.e., the bit line BL and the complement bit line BLB) to one of the bit line pairs in the memory array 120 accordingly to a selection signal YSEL, so as to write data into the bit cell BC on a target column.

For example, when the target column is the 1$^{st}$ column, the selection circuit 144 is configured to couple the bit line BL and the complement bit line BLB in the local input/output circuit 140 with the bit line BL1 and the complement bit line BLB1 in the memory array 120; when the target column is the n$^{th}$ column, the selection circuit 144 is configured to couple the bit line BL and the complement bit line BLB in the local input/output circuit 140 with the bit line BLn and the complement bit line BLBn in the memory array 120.

In some embodiments, during a read operation for reading data from a target column, the selection circuit 144 is configured to couple the bit line pair (i.e., the bit line BL and the complement bit line BLB in the local input/output circuit 140) to one of the bit line pairs corresponding to the target column in the memory array 120 accordingly to the selection signal YSEL, the read/write circuit 146 is configured to sense voltage levels from the bit line pair, and, so as to read data from the bit cell BC on the target column.

As illustratively shown in FIG. 1, the modulation circuits 142a and 142b are coupled with the bit line pairs on the columns of the memory array 120. For example, one modulation circuit 142a is coupled with the bit line BL1 and the complement bit line BLB1 on the 1$^{st}$ column, and another modulation circuit 142b is coupled with the bit line BLn and the complement bit line BLBn on the n$^{th}$ column. For brevity, only two modulation circuits 142a and 142b on two columns of the memory array 120 are illustrated in FIG. 1 for demonstrational purpose. However, the embodiments of the disclosure are not limited to a specific amount of modulation circuits.

In some embodiments, the modulation circuit 142a is configured to modulate voltage levels on the bit line BL1 and the complement bit line BLB1 when the memory device 100 is not accessing (e.g., writing into or reading from) the bit cells BC. For example, during the write operation or the read operation, one of the bit line BL1 and the complement bit line BLB1 will be charged to a higher level, such as a high reference voltage level VDD, and the other of the bit line BL1 and the complement bit line BLB1 will be discharged to a lower level, such as a low reference voltage level VSS or a ground level.

Outside the write operation or the read operation, in some embodiments, the modulation circuit 142a is triggered by the control signal BLEQB and configured to couple the bit line BL1 and the complement bit line BLB1 together with each other, so as to equalize the voltage levels on the bit line BL1 and the complement bit line BLB1. In some embodiments, outside the write operation or the read operation, the modulation circuit 142a is configured to precharge the voltage levels on the bit line BL1 and the complement bit line BLB1 to a fixed level, such as the high reference voltage level VDD. In this case, the bit line BL1 and the complement bit line BLB1 are configured at the fixed level instead of being in floating levels, and it can secure the data stored in the bit cell BC and avoid these data to be affected by unexpected floating levels on the bit line BL1 and the complement bit line BLB1.

On the other hand, during the write operation or the read operation, the modulation circuit 142a is deactivated by the control signal BLEQB, such that the voltage levels of the bit line BL1 and the complement bit line BLB1 are released and not controlled by the modulation circuit 142a. In this case, the bit line BL1 and the complement bit line BLB1 can be used in the write operation or the read operation by the read/write circuit 146.

Similarly, outside the write operation or the read operation, the modulation circuit 142b is configured to equalize the voltage levels on the bit line BLn and the complement bit line BLBn, and/or configured to precharge the voltage levels on the bit line BLn and the complement bit line BLBn to a fixed level.

As illustratively shown in FIG. 1, the word line decoder 180 is coupled with the word lines WL1~WL2k. In some embodiments, the word line decoder 180 is configured to generate word line signals to select a target row to be written or read in the write operation or the read operation. In response to that the 1$^{st}$ row is selected, the word line decoder 180 is configured to generate the word line signal to the word line WL1 to activate the bit cells BC connected with the word line WL1. In this case, the memory device 100 is able to perform the write operation or the read operation onto the bit cells BC on the 1$^{st}$ row. In response to that the 2$^{nd}$ row is selected, the word line decoder 180 is configured to generate the word line signal to the word line WL2 to activate the bit cells BC connected with the word line WL2. In response to that the row on the top side is selected, the word line decoder 180 is configured to generate the word line signal to the word line WL2$k$ to activate the bit cells BC connected with the word line WL2$k$. For the memory device 100 with a large data capacity, the memory device 100 may have 512 rows, 1024 rows or even more rows. In this case, a depth distance DPf between the first word line WL1 and the last word line WL2$k$ of the word lines WL1~WL2$k$ is relatively longer.

In some embodiments, the word line decoder 180 is controlled by the control signal DEC generated by the control signal generator 162. In some embodiments, the word line decoder 180 includes several decoder units 182, and each of the decoder units 182 is configured to provide one word line signal to one of the word lines WL1~WL2$k$. The control signal DEC is used to control functions of addressing and gating on the decoder units 182 in the word line decoder 180. In some embodiments, the memory array 120 may include a lot of rows of the bit cells BC. When the control signal DEC is transmitted from the side of the control signal generator 162 to the decoder units 182 the word line decoder 180, the control signal DEC arrives different decoder units 182 at different time points. For example, for the decoder unit 182 at the bottom side closer to the control signal generator 162, the control signal DEC arrives earlier. On the other hand, for the decoder unit 182 at the top side far from the control signal generator 162, the control signal DEC arrives later. In other words, the control signal DEC will arrive different decoder units 182 at different timing points. Because aforesaid different arrival timings of the control signal DEC, the word line signals generated by the decoder units 182 in the word line decoder 180 to the word lines WL1~WL2$k$ have pulses with different timings.

When the depth distance DPf is longer, a time difference between pulses on the word line signals on the word line WL1 and the word line WL2$k$ is going to be larger. If the control signal generator 162 generates the control signal BLEQB without considering the time difference on the word line signals on the word line WL1 and the word line WL2$k$, the control signal BLEQB may not be able to activate the modulation circuits 142$a$ and 142$b$ at the correct timing, and it may cause some issues, such as degrading of read/write margin, increasing a crowbar current, degrading of stability of bit cells. Further details will be discussed in following paragraphs.

In some embodiments, the control signal generator 162 is configured to generate the control signal BLEQB in reference with the depth distance DPf between the first word line WL1 and the last word line WL2$k$ of the word lines WL1~WL2$k$, so as to avoid aforesaid issues.

Figure 2:
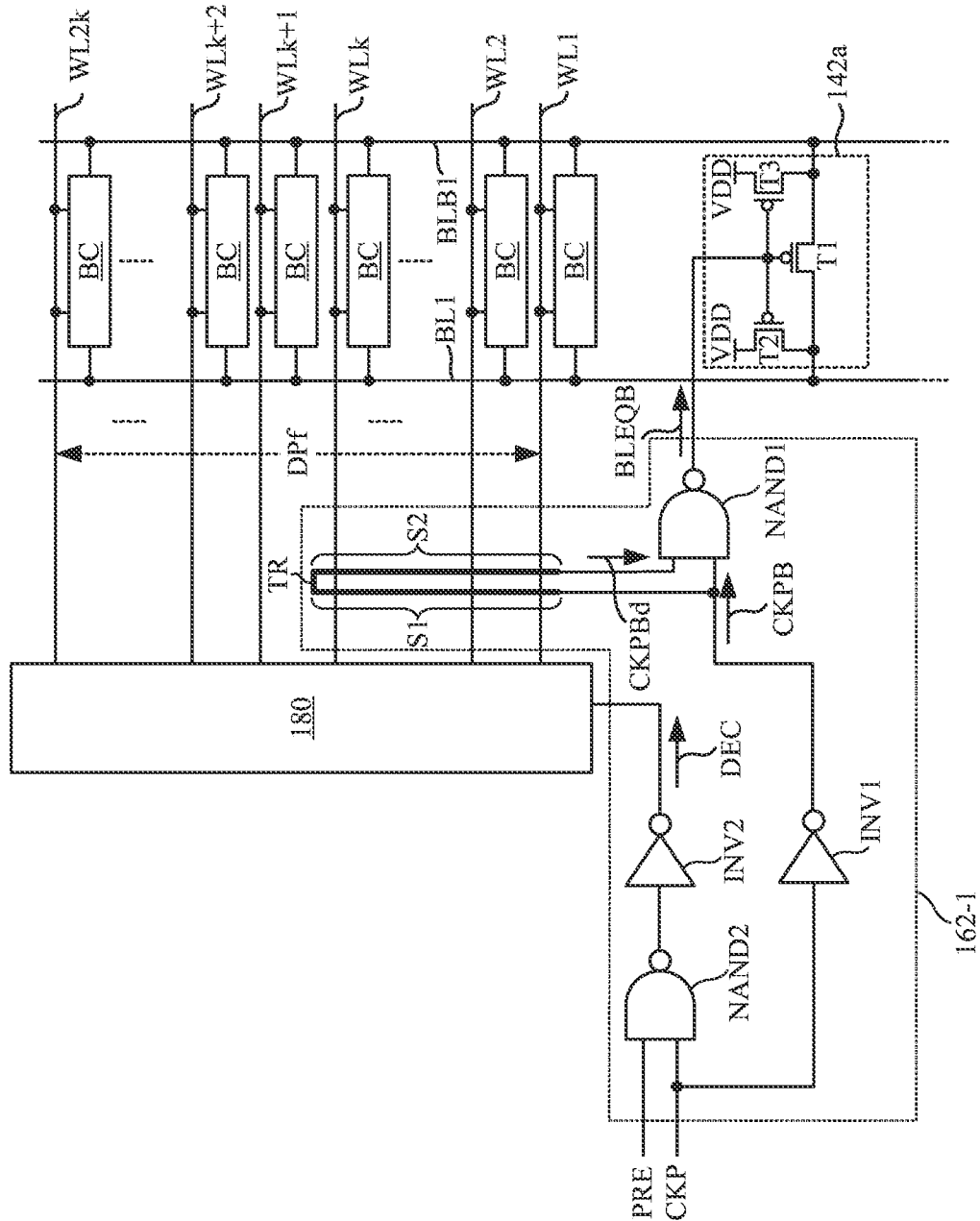
FIG. 2 is a schematic diagram illustrating internal structures of the modulation circuits and the control signal generator in FIG. 1 in accordance with various embodiments of the present disclosure.
Figure 3:
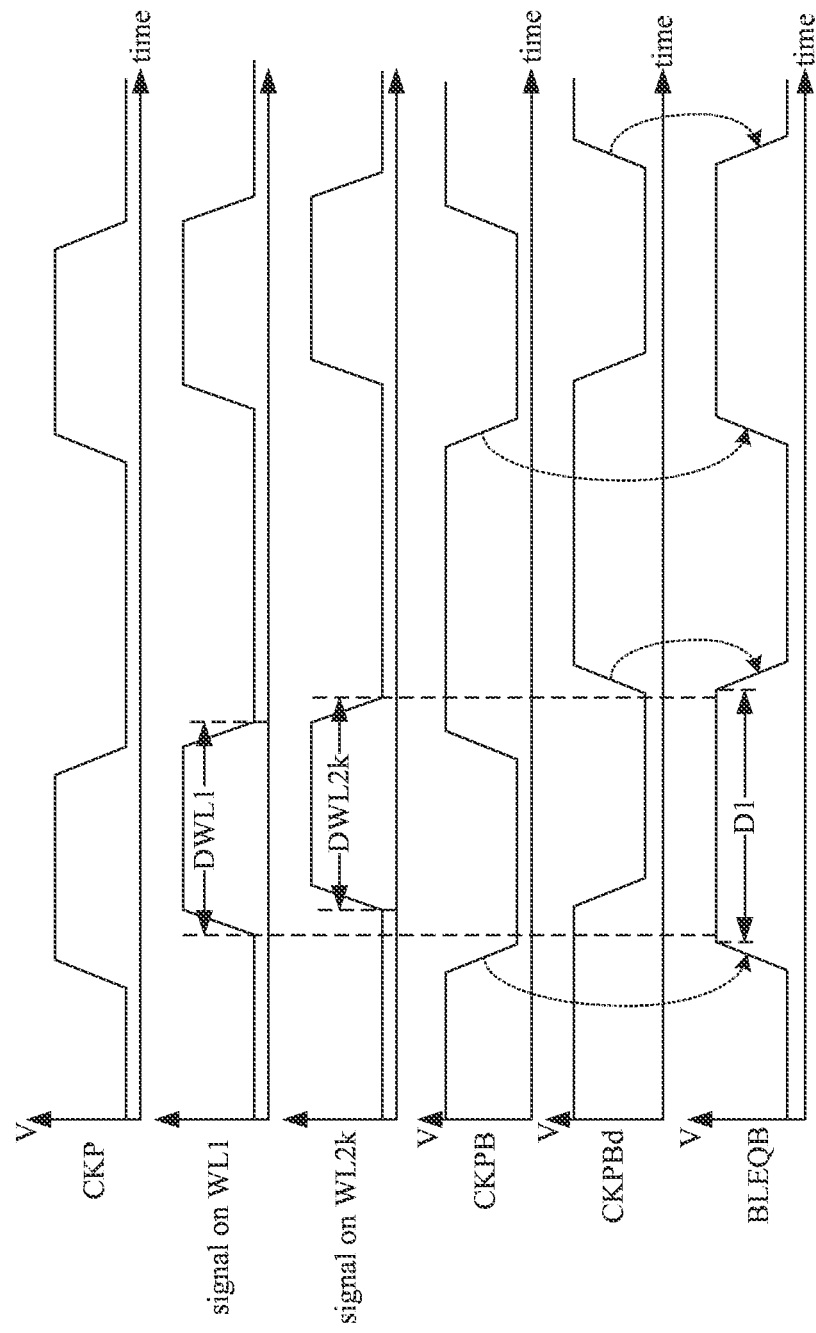
FIG. 3 is a signal waveform illustrating related signals generated in the memory device in FIG. 1 and FIG. 2 in accordance with various embodiments of the present disclosure.

Reference is further made to FIG. 2 and FIG. 3. FIG. 2 is a schematic diagram illustrating internal structures of the modulation circuits and the control signal generator in FIG. 1 in accordance with various embodiments of the present disclosure. FIG. 3 is a signal waveform illustrating related signals generated in the memory device 100 in FIG. 1 and FIG. 2 in accordance with various embodiments of the present disclosure. With respect to the embodiments of FIG. 1, like elements in FIG. 2 and FIG. 3 are designated with the same reference numbers for ease of understanding. It is noticed that, for brevity, FIG. 2 illustrates structures related to the 1$^{st}$ column of the memory array 120. Structures related to other columns are similar and can be understood through the embodiments shown in FIG. 2. The control signal generator 162-1 illustratively shown in FIG. 2 is one embodiment of the control signal generator 162 shown in FIG. 1.

As illustratively shown in FIG. 2, the modulation circuit 142$a$ includes transistors T1, T2 and T3. The gates of the transistors T1, T2 and T3 are controlled by the control signal BLEQB. Two terminals of the transistor T1 is connected with the bit line BL1 and the complement bit line BLB1.

When the control signal BLEQB is at a low voltage level (e.g., 0V, GND level, or VSS level), the transistor T1 is switched on to couple the bit line BL1 and the complement bit line BLB1 (of the bit line pair on the 1$^{st}$ column) together with each other, so as to equalize the voltage levels on the bit line BL1 and the complement bit line BLB1. When the control signal BLEQB is at the low voltage level (e.g., 0V), the transistor T2 is switched on to connect the bit line BL1 to the high reference voltage level VDD, so as to fix the voltage level on bit line BL1 at the high reference voltage level VDD. When the control signal BLEQB is at the low voltage level (e.g., 0V), the transistor T3 is switched on to connect the complement bit line BLB1 to the high reference voltage level VDD, so as to fix the voltage level on complement bit line BLB1 at the high reference voltage level VDD. In this case, the bit line BL1 and the complement bit line BLB1 are configured at the fixed level instead of being in floating levels, and it can secure the data stored in the bit cell BC and avoid these data to be affected by unexpected floating levels on the bit line BL1 and the complement bit line BLB1.

In some embodiments, outside the write operation or the read operation, the modulation circuit 142$a$ is also configured to precharge the voltage levels on the bit line BL1 and the complement bit line BLB1 to a fixed level, such as the high reference voltage level VDD. In this case, the bit line BL1 and the complement bit line BLB1 are configured at the fixed level instead of being in floating levels, and it can secure the data stored in the bit cell BC and avoid these data to be affected by unexpected floating levels on the bit line BL1 and the complement bit line BLB1.

When the control signal BLEQB is at a high voltage level (e.g., 3V, 5V or VDD level), the transistors T1, T2 and T3 in the modulation circuit 142$a$ are all switched off, such that the modulation circuit 142$a$ is deactivated, and the voltage levels on the bit line BL1 and the complement bit line BLB1 are released from the modulation circuit 142$a$ and controlled by the read/write circuit 146 shown in FIG. 1.

As illustratively shown in FIG. 2 and FIG. 3, during a time duration DWL1, the word line signal to the word line WL1 is switched to the high voltage level, the bit cell BC connected with the word line WL1 shall be ready to read/write, such that a rising edge of the control signal BLEQB is required to arrive at the same time as (or before) a rising edge of the word line signal on the word line WL1. If the rising edge of the control signal BLEQB arrives later than the rising edge of the word line signal on the word line WL1, the modulation circuit 142$a$ may not release the bit line BL1 and the complement bit line BLB1 in time, such that a read/write margin to the bit cell BC will be degraded.

As illustratively shown in FIG. 1, FIG. 2 and FIG. 3, during a time duration DWL2k, the word line signal to the word line WL2k is switched to the high voltage level, the bit cell BC connected with the word line WL2k shall be ready to read/write, such that a falling edge of the control signal BLEQB is required to arrive at the same time as (or after) a falling edge of the word line signal on the word line WL2k. If the falling edge of the control signal BLEQB arrives before the falling edge of the word line signal on the word line WL2k, the modulation circuit 142a may boost both of the voltage levels on the bit line BL1 and the complement bit line BLB1 to the high voltage levels while the word line WL2k still activating an access to the bit cell BC, such that the data bit stored in the bit cell BC connected with the word line WL2k may be damaged due to the wrong configuration of the voltage levels on the bit line BL1 and the complement bit line BLB1 (e.g., the voltage levels on the bit line BL1 and the complement bit line BLB1 are both charged to high levels by the modulation circuit 142b). Similarly, if the falling edge of the control signal BLEQB arrives before the falling edge of the word line signal on the word line WL2k, other modulation circuits (e.g., the modulation circuit 142b) may boost both of the voltage levels on their corresponding bit lines (e.g., the bit line BLn) and their corresponding complement bit lines (e.g., the complement bit line BLBn) to the high voltage levels while the word line WL2k still activating the access to the bit cells BC on the corresponding row.

In addition, as shown in FIG. 1, the bit lines BL1~BLn and the complement bit lines BLB1~BLBn are arranged across the word lines WL1~WL2k, and coupling effect happen to signals between these signal lines. At the falling edge of the control signal BLEQB, the control signal BLEQB activates the modulation circuits 142a~142b, such that the voltage levels on the bit lines BL1~BLn and the complement bit line BLB1~BLBn are raised to the high voltage levels by their corresponding modulation circuits 142a~142b. Due to the coupling effect, the word line signals on the word lines WL1~WL2k are boosted to a higher level according to the raised voltage levels on the bit lines BL1~BLn and the complement bit line BLB1~BLBn. In particular, if the falling edge of the control signal BLEQB arrives before the falling edge of the word line signal on the word line WL2k, the word line signal on the word line WL2k will be raised further higher (e.g., over VDD level), and it may cause instability of the bit cells BC connected with the word line WL2k.

In other words, the time duration D1 of the control signal BLEQB switching to the high voltage level is required to enclose the rising edge of the word line signal on the word line WL1 and the falling edge of the word line signal on the word line WL2k. In some embodiments, the control signal generator 162-1 is able to generate the control signal BLEQB at the correct timing with reference to the depth distance DPf.

As shown in FIG. 2, the control signal generator 162-1 in some embodiments includes a tracking wiring TR, two inverters INV1, INV2 and two logic gates NAND1, NAND2. In some embodiments, the control signal generator 162-1 receives an input control signal PRE and an input clock signal CKP.

The tracking wiring TR has a tracking length positively correlated with the depth distance DPf of the word lines WL1~WL2k. As shown in FIG. 2, in some embodiments, the tracking wiring TR includes a first tracking segment S1 and a second tracking segment S2. The first tracking segment S1 extends from a bottom side edge of the word lines WL1~WL2k toward a half position (e.g., at a horizontal level between the word line WLk and the word line WLk+1) of the word lines WL1~WL2k. The second tracking segment S2 extends from the half position of the word lines WL1~WL2k toward the bottom side edge of the word lines WL1~WL2k. In this case, the sum of lengths of the first tracking segment S1 and the second tracking segment S2 is similar or approximately equal to the depth distance DPf.

The logic gate NAND2 and the inverter INV2 are configured to generate the control signal DEC to the word line decoder 180 according to the input control signal PRE and the input clock signal CKP. In this case, the control signal DEC is generated with two gate delays (induced by the logic gate NAND2 and the inverter INV2) relative to the input clock signal CKP.

The inverter INV1 is configured to invert the input clock signal CKP into an inverted clock signal CKPB. The logic gate NAND1 includes a first input terminal, a second input terminal and an output terminal. The first input terminal of the logic gate NAND1 is configured to receive the inverted clock signal CKPB. The second input terminal of the logic gate NAND1 is configured to receive an invert-delayed clock signal CKPBd (which is the inverted clock signal CKPB after being delayed through the tracking wiring TR).

The output terminal of the logic gate NAND1 is configured to produce the control signal BLEQB. The logic gate NAND1 is configured to perform a NAND Boolean function between two input terminals and generate the control signal BLEQB. A relationship between the inputs and the output of the logic gate NAND1 is shown in Table 1.

TABLE 1

| first input terminal (CKPB) | second input terminal (CKPBd) | output terminal (BLEQB) |
|---|---|---|
| H | H | L |
| L | H | H |
| H | L | H |
| L | L | H |

As shown in FIG. 3 and Table 1, the rising edge of the control signal BLEQB is triggered by the falling edge of the inverted clock signal CKPB. In the embodiments shown in FIG. 2, the rising edge of the control signal BLEQB arrives with two gate delays (induced by the inverter INV1 and the logic gate NAND1) relative to the input clock signal CKP.

It is noticed that the control signal DEC is generated with two gate delays relative to the input clock signal CKP, and the control signal DEC is transmitted into the word line decoder 180 (for triggering the decoder units 182 shown in FIG. 1) to generate the word line signals on the word lines WL1~WL2k. In this case, the rising edge of the word line signal on the word line WL1 arrives with (or later than) two gate delays relative to the input clock signal CKP. As mentioned above, the rising edge of the control signal BLEQB arrives with two gate delays relative to the input clock signal CKP. Therefore, the rising edge of the control signal BLEQB is able to enclose the word line signal on the word line WL1.

In some embodiments, because the invert-delayed clock signal CKPBd is delayed by the tracking wiring TR corresponding to the to the depth distance DPf, a timing of the invert-delayed clock signal CKPBd will be similar to a timing that the control signal DEC arrives the decoder unit connected to the word line WL2k on the top side. As shown in FIG. 3, the timing of the rising edge of the invert-delayed clock signal CKPBd is similar to the word line signal on the word line WL2k. As shown in FIG. 3 and Table 1, the falling edge of the control signal BLEQB is triggered by the rising edge of the invert-delayed clock signal CKPBd. As embodiments shown in FIG. 3, the falling edge of the control signal BLEQB is decided by the rising edge of the invert-delayed clock signal CKPBd, and the falling edge of the control signal BLEQB arrives at a similar timing when the falling edge of the word line signal on the word line WL2k arrives.

In other words, the time duration D1 of the control signal BLEQB switching to the high voltage level is prolonged in accordance with the invert-delayed clock signal CKPBd which is delayed by the tracking wiring TR. With the help of the tracking wiring TR to track the delay about the depth distance DPf, the falling edge of the control signal BLEQB is able to enclose the falling edge of the word line signal on the word line WL2k. Since the falling edge of the control signal BLEQB is able to enclose the falling edge of the word line signal on the word line WL2k, it can avoid the modulation circuit 142a to be activated too early before the access paths to the bit cells BC are turned off by the word line signals on the word lines WL1~WL2k. Therefore, it can avoid data bits stored in the bit cells from being damaged, because the modulation circuits 142a is activated (to charge the corresponding bit line BL1 and the complement bit line BLB1) after the word lines WL1~WL2k is pulled low to turn off the pass gates of the bit cells, such that it can enhance the stability of data bits stored in the bit cells.

Figure 4:
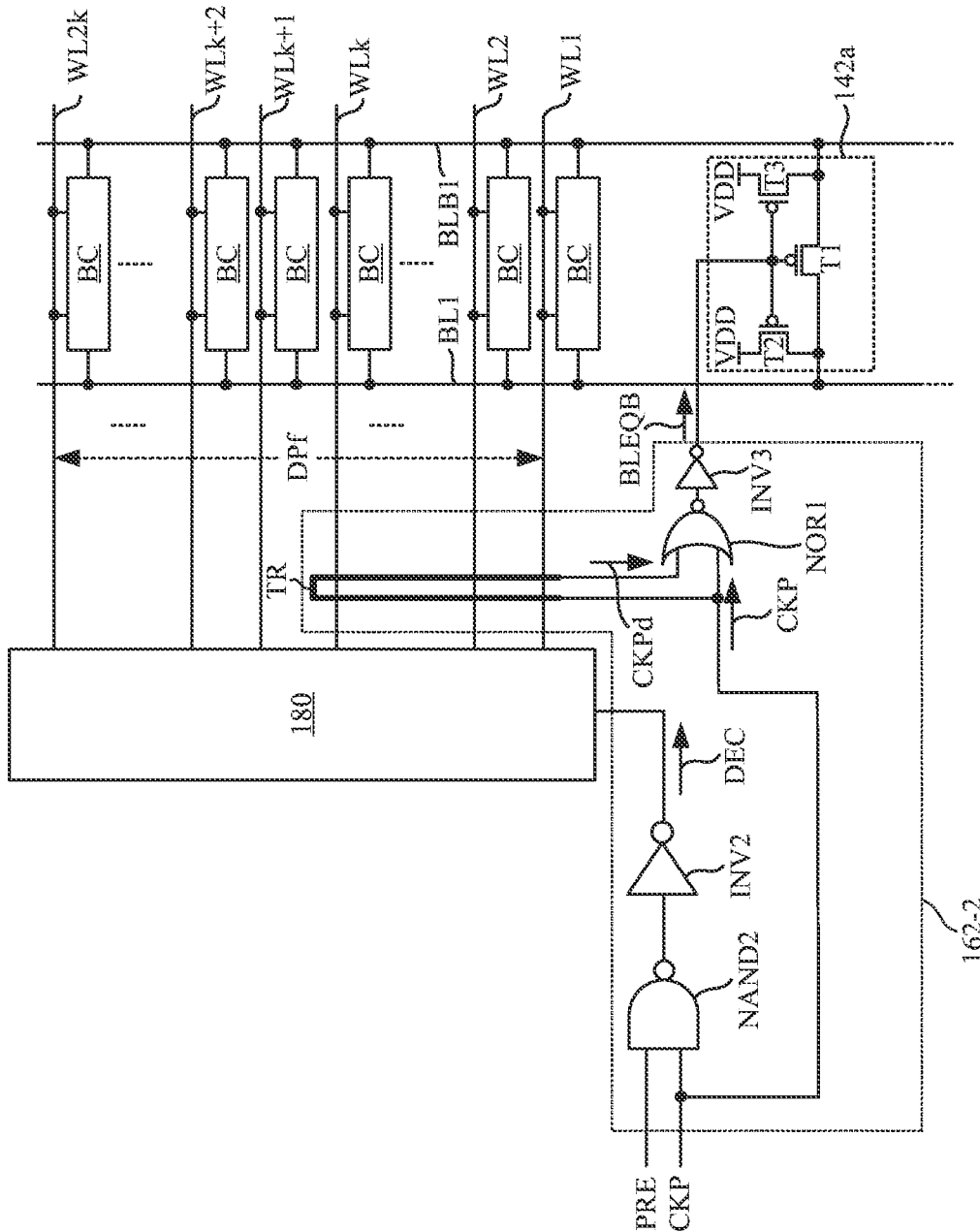
FIG. 4 is a schematic diagram illustrating internal structures of the modulation circuit and the control signal generator in FIG. 1 in accordance with various embodiments of the present disclosure.

It is noticed that the control signal generator 162-1 illustratively shown in FIG. 2 is one exemplary embodiment to achieve the control signal generator 162 shown in FIG. 1. However, the disclosure is not limited thereto. Reference is further made to FIG. 4, which illustrates internal structures of the modulation circuit and the control signal generator in FIG. 1 in accordance with various embodiments of the present disclosure. The control signal generator 162-2 illustratively shown in FIG. 4 is another embodiment of the control signal generator 162 shown in FIG. 1. Compared to the control signal generator 162-1 illustratively shown in FIG. 2, the control signal generator 162-2 in FIG. 4 utilize a different combination of logic gates and inverters to generate the control signal BLEQB. As shown in FIG. 2, the control signal BLEQB is generated by the logic gate NAND1 according to the inverted clock signal CKPB and the invert-delayed clock signal CKPBd. On the other hand, as shown in FIG. 4, the control signal BLEQB is generated by a logic gate NOR1 and an inverter INV3 according to an input clock signal CKP and a delayed clock signal CKPd.

As shown in FIG. 4, the control signal generator 162-2 in some embodiments includes a tracking wiring TR, two logic gates NAND2, NOR1 and two inverters INV2 and INV3. In some embodiments, the control signal generator 162-2 receives an input control signal PRE and the input clock signal CKP.

The tracking wiring TR has a tracking length positively correlated with the depth distance DPf of the word lines WL1~WL2k.

The logic gate NAND2 and the inverter INV2 are configured to generate the control signal DEC to the word line decoder 180 according to the input control signal PRE and the input clock signal CKP. In this case, the control signal DEC is generated with two gate delays (induced by the logic gate NAND2 and the inverter INV2) relative to the input clock signal CKP.

The logic gate NOR1 includes a first input terminal, a second input terminal and an output terminal. The first input terminal of the logic gate NOR1 is configured to receive the input clock signal CKP. The second input terminal of the logic gate NOR1 is configured to receive a delayed clock signal CKPd (which is the input clock signal CKP after being delayed through the tracking wiring TR).

The output terminal of the logic gate NOR1 is connected to the inverter INV3. The inverter INV3 is configured to invert an output signal from the logic gate NOR1 and accordingly produce the control signal BLEQB. The logic gate NOR1 is configured to perform an NOR Boolean function between two input terminals and generate the output signal, which is further inverted by the inverter INV3 into the control signal BLEQB. A relationship between the inputs and the outputs of the logic gate NOR1 and the inverter INV3 is shown in Table 2.

TABLE 2

| first input terminal (CKP) | second input terminal (CKPd) | output terminal of NOR1 | output terminal of INV3 (BLEQB) |
|---|---|---|---|
| L | L | H | L |
| L | H | L | H |
| H | L | L | H |
| H | H | L | H |

Based on the Boolean logic:
BLEQB generated by the output of the inverter INV3 in FIG. 4
=NOT[the output of the logic gate NOR1 in FIG. 4]
=NOT[NOT[CKP∪CKPd]]
=CKP∪CKPd
=NOT[CKPB∩CKPBd]
=the output of the logic gate NAND1 in FIG. 2

In other words, the logic gate NOR1 and the inverter INV3 in FIG. 4 outputs the control signal BLEQB in a same logic as the logic gate NAND1 discussed in embodiments of FIG. 2.

In a similar way, a rising edge of the control signal BLEQB generated by the logic gate NOR1 and the inverter INV3 in FIG. 4 is triggered by a rising edge of the input clock signal CKP. With the help of the tracking wiring TR to track the delay about the depth distance DPf, a falling edge of the control signal BLEQB generated by the logic gate NOR1 and the inverter INV3 in FIG. 4 is triggered by a falling edge of the delayed clock signal CKPd, which is equal to the input clock signal CKP after being delayed by the tracking wiring TR. In this case, the control signal BLEQB is able to enclose the rising edge of the word line signal on the word line WL1 and the falling edge of the word line signal on the word line WL2k.

Figure 5:
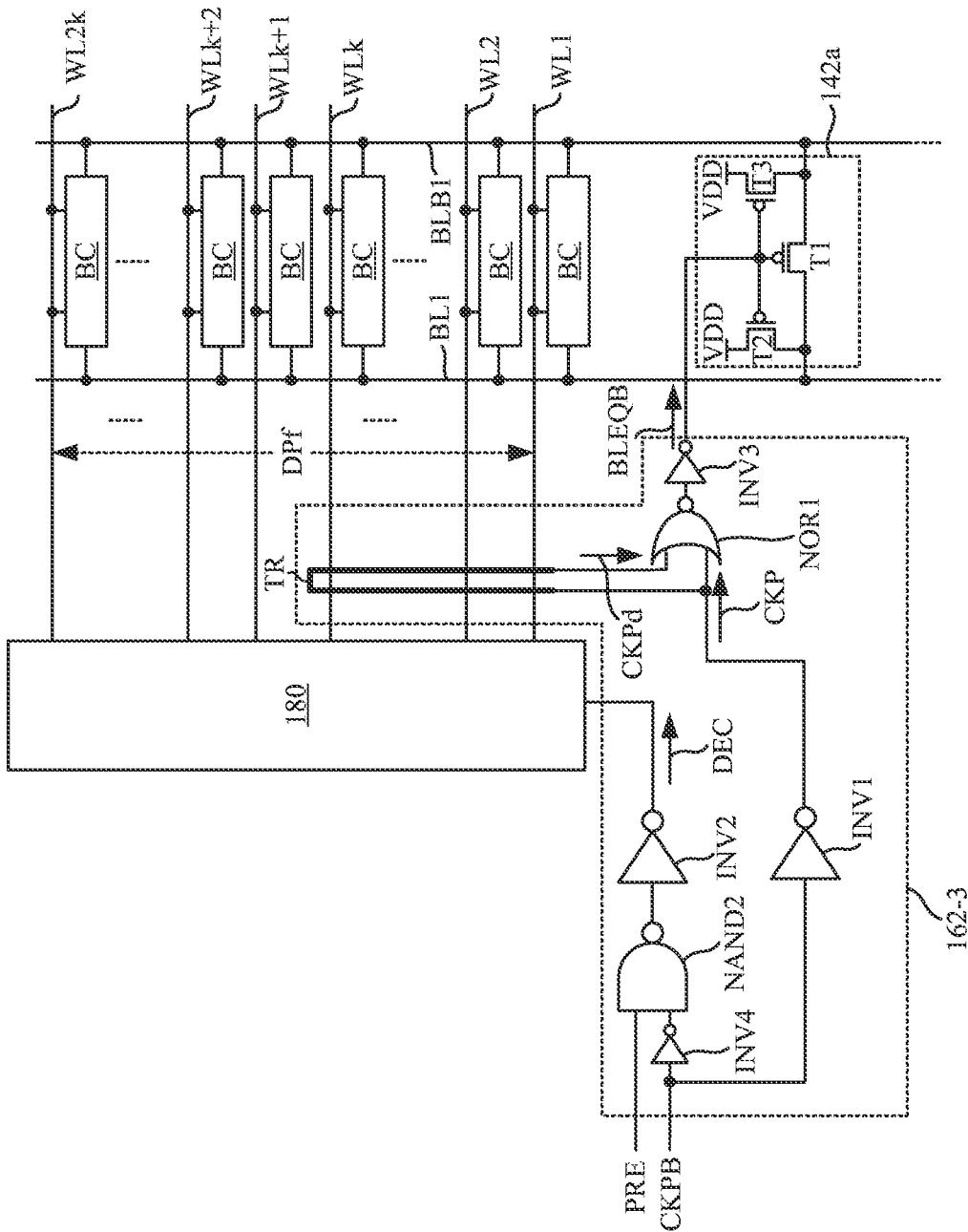
FIG. 5 is a schematic diagram illustrating internal structures of the modulation circuit and the control signal generator in FIG. 1 in accordance with various embodiments of the present disclosure.

Reference is further made to FIG. 5, which illustrates internal structures of the modulation circuit and the control signal generator in FIG. 1 in accordance with various embodiments of the present disclosure. The control signal generator 162-3 illustratively shown in FIG. 5 is another embodiment of the control signal generator 162 shown in FIG. 1. Compared to the control signal generator 162-1 illustratively shown in FIG. 2 and the control signal generator 162-2 illustratively shown in FIG. 4, the control signal generator 162-3 in FIG. 5 utilize a different combination of logic gates and inverters to generate the control signal BLEQB. As shown in FIG. 2, the control signal BLEQB is generated by the logic gate NAND1 according to the inverted clock signal CKPB and the invert-delayed clock signal CKPBd. As shown in FIG. 5, the control signal BLEQB is generated by a logic gate NOR1 and an inverter INV3 according to an input clock signal CKP and a delayed clock signal CKPd. Compared to the control signal generator 162-2 shown in FIG. 4, the control signal generator 162-3 in FIG. 5 includes extra inverters for converting clock signals.

As shown in FIG. 5, the control signal generator 162-3 in some embodiments includes a tracking wiring TR, logic gates NAND2 and NOR1 and inverters INV1~INV4. In some embodiments, the control signal generator 162-3 receives an input control signal PRE and an inverted input clock signal CKPB. The tracking wiring TR has a tracking length positively correlated with the depth distance DPf of the word lines WL1~WL2k.

The control signal generator 162-3 shown in FIG. 5 is similar to the control signal generator 162-2 shown in FIG. 4, except that the control signal generator 162-3 shown in FIG. 5 further includes two extra inverters INV1 and INV4. The inverter INV1 is configured to invert the inverted input clock signal CKPB into the input clock signal CKP, which is transmitted to the logic gate NOR1. The inverter INV3 is configured to invert an output of the logic gate NOR1 to generate the control signal BLEQB. The inverter INV4 is configured to invert the inverted input clock signal CKPB into the input clock signal CKP, which is transmitted to the logic gates NAND2.

As shown in FIG. 5, the logic gate NOR1 receives the input clock signal CKP and the delayed input clock signal CKPd, and the output of the logic gate NOR1 is further inverted by the inverter INV3 into the control signal BLEQB. Based on the Boolean logic, the control signal BLEQB generated by the inverter INV3 in embodiments shown in FIG. 5 is equal to the output of the inverter INV3 in embodiments shown in FIG. 4, and also equal to the output of the logic gate NAND1 in embodiments shown in FIG. 2.

In a similar way, a rising edge of the control signal BLEQB generated by the inverter INV3 and the logic gate NOR1 in FIG. 5 is triggered by a rising edge of the input clock signal CKP. With the help of the tracking wiring TR to track the delay about the depth distance DPf, a falling edge of the control signal BLEQB generated by the inverter INV3 and the logic gate NOR1 in FIG. 5 is triggered by a falling edge of the delayed clock signal CKPd, which is equal to the input clock signal CKP after being delayed by the tracking wiring TR. In this case, the control signal BLEQB generated by the inverter INV3 and the logic gate NOR1 in FIG. 5 is able to enclose the rising edge of the word line signal on the word line WL1 and the falling edge of the word line signal on the word line WL2k.

Figure 6:
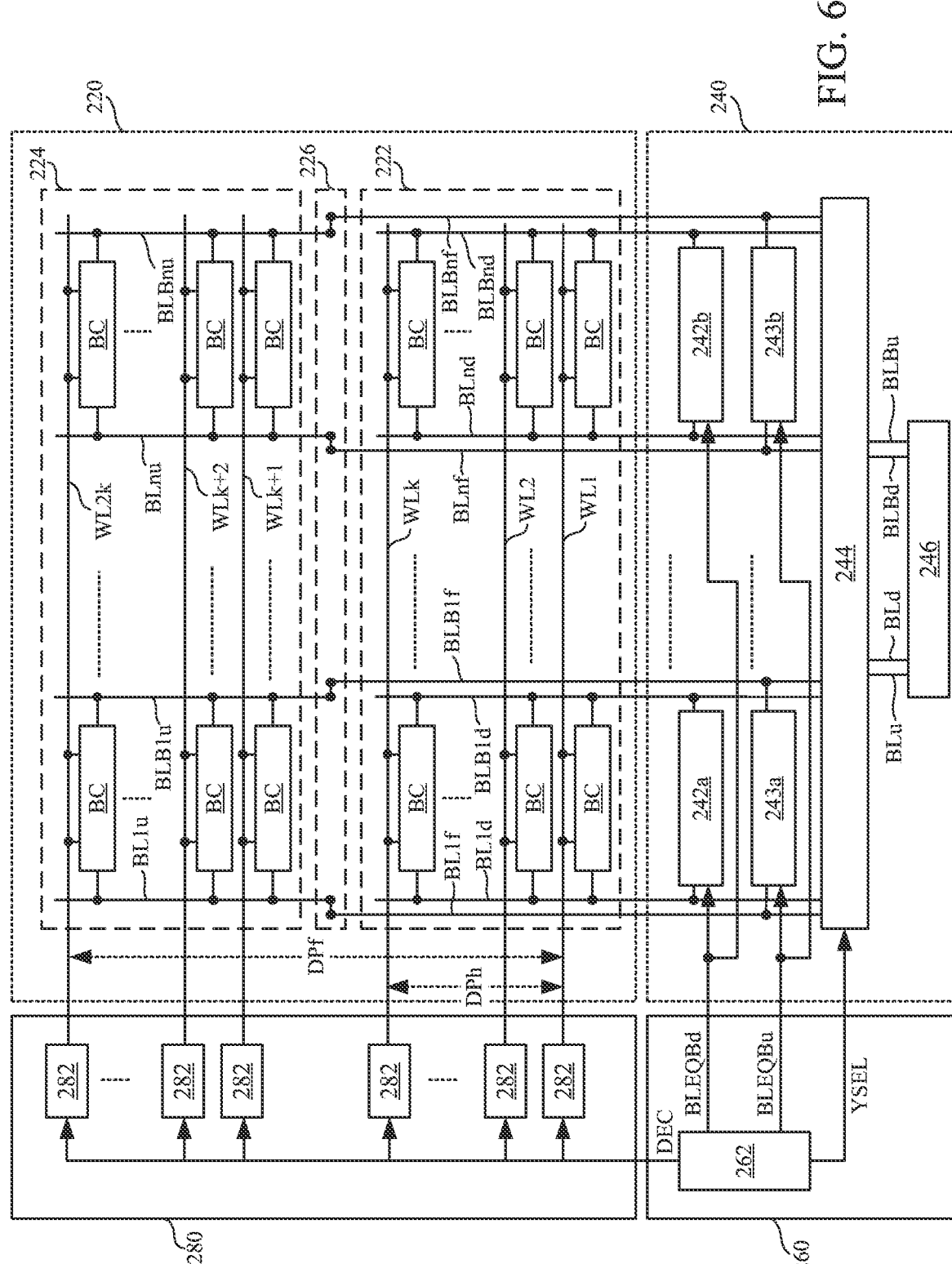
FIG. 6 is a schematic diagram illustrating a memory device in accordance with various embodiments of the present disclosure.

Reference is further made to FIG. 6. FIG. 6 is a schematic diagram illustrating another memory device 200 in accordance with various embodiments of the present disclosure. Compared to the memory device 100 shown in FIG. 1 including the bit cells BC arranged in one array without being divided into subarrays, the memory device 200 in FIG. 6 includes bit cells BC arranged in different subarrays and flying bit lines for transmitting signals across one of the subarrays. In embodiments illustratively shown in FIG. 6, the memory device 200 includes a memory array 220 including several bit cells BC arranged on multiple rows and columns. As shown in embodiments of FIG. 6, the memory array 220 includes two a subarray 222, another subarray 224 and a strap cell 226 located between these two subarrays 222 and 224.

As illustratively shown in FIG. 6, the bit cells BC located adjacent to the bottom side of the memory array 220 are grouped into the subarray 222, and the bit cells BC located adjacent to the top side of the memory array 220 are grouped into the subarray 224. As illustratively shown in FIG. 6, in some embodiments, the bit cells BC on the same row are connected to the same word line. For example, the bit cells BC on the $1^{st}$ row (started from the bottom side of the memory array 220) are connected to the word line WL1; the bit cells BC on the $2^{nd}$ row are connected to the word line WL2; and the bit cells BC on the $k^{th}$ row are connected to the word line WLk. The bit cells BC connected with the word lines WL1~WLk are grouped into the subarray 222.

On the other hand, the bit cells BC on the $k+1^{th}$ row are connected to the word line WLk+1; the bit cells BC on the $k+2^{th}$ row are connected to the word line WLk+2; and, the bit cells BC on the 2k row are connected to the word line WL2k. The bit cells BC connected with the word lines WLk+1~WL2k are grouped into the subarray 224.

In some embodiments, k is a positive integer. For example, in the memory array 120 with 2048 rows of bit cells BC, k is equal to 1024 and there are 2048 word lines distributed from the bottom side to the top side of the memory array 120. In this example, the bit cells BC on the $1^{st}$ row to the $1024^{th}$ row are in the subarray 222 and the bit cells BC on the $1025^{th}$ row to the $2048^{th}$ row are in the subarray 224.

The bit cells BC in the subarray 222 on the same column are connected to one bit line pair. For example, the bit cells BC in the subarray 222 on the $1^{st}$ column on the left are connected to one bit line pair, which includes one bit line BL1d and one complement bit line BLB1d, and the bit cells BC in the subarray 222 on the $n^{th}$ column on the right side are connected to another bit line pair, which includes another bit line BLnd and another complement bit line BLBnd. As shown in FIG. 6, the bit line BL1d and one complement bit line BLB1d extend along the $1^{st}$ column of the subarray 222, from the bottom side edge of the memory array 220, and terminating between the subarray 222 and the subarray 224. In some embodiments, n is a positive integer. For example, n can be about 8, 16, 32 or other suitable numbers. For brevity, only two columns of the memory array 220 are illustrated in FIG. 6 for demonstrational purpose. However, the embodiments of the disclosure are not limited to a specific amount of columns in the memory array 220.

The bit cells BC in the subarray 224 on the same column are connected to one bit line pair. For example, the bit cells BC in the subarray 224 on the $1^{st}$ column on the left are connected to another bit line pair, which includes one bit line BL1u and one complement bit line BLB1u, and the bit cells BC in the subarray 222 on the $n^{th}$ column on the right side are connected to another bit line pair, which includes another bit line BLnu and another complement bit line BLBnu. As shown in FIG. 6, the bit line BL1u and one complement bit line BLB1u extend, along the $1^{st}$ column of the subarray 224, from the strap cell 226 of the memory array 220 to the top side edge of the memory array 220. In some embodiments, the strap cell 226 is located at a gap space between the subarrays 222 and 224. In some embodiments, the flying bit line BL1f and the complement flying bit line BLB1f are connected to the bit line BL1u and one complement bit line BLB1u at the strap cell 226.

As illustratively shown in FIG. 6, in some embodiments, the memory device 200 includes a local input/output circuit 240, a main control circuit 260 and a word line decoder 280. The main control circuit 260 is coupled with the local input/output (LIO) circuit 240 and the word line decoder 280. Some functions and behaviors of the local input/output circuit 240, the main control circuit 260 and the word line decoder 280 of embodiments in FIG. 6 are similar to the local input/output circuit 140, the main control circuit 160 and the word line decoder 180 of embodiments in FIG. 1 and FIG. 2, and can be referred to aforesaid embodiments discussed in FIG. 1 and FIG. 2.

In some embodiments, the main control circuit 260 includes a control signal generator 262, and the control signal generator 262 is configured to generate some control signals to control/activate/deactivate functions in the local input/output circuit 240 and the word line decoder 280. As illustratively shown in FIG. 6, in some embodiments, the control signal generator 262 is configured to generate a control signal BLEQBd (corresponding to the subarray 222) to the local input/output circuit 240, another control signal BLEQBu (corresponding to the subarray 224) to the local input/output circuit 240, the selection signal YSEL to the local input/output circuit 240, and a control signal DEC to the word line decoder 280. In some other embodiments, the control signal generator 262 is able to generate other control signals for controlling other functions. The embodiments of the disclosure are not limited to these control signals.

In some embodiments, the local input/output circuit 240 includes modulation circuits 242a~242b (corresponding to the subarray 222), modulation circuits 243a~243b (corresponding to the subarray 224), a selection circuit 244 and a read/write circuit 246.

During a write operation to the subarray 222, the read/write circuit 246 is configured to generate a write signal and a complement write signal onto a bit line pair, which includes a bit line BLd and a complement bit line BLBd in the local input/output circuit 240, and the selection circuit 244 is configured to couple the bit line pair (i.e., the bit line BLd and the complement bit line BLBd) to one of the bit line pairs in the subarray 222 of the memory array 220 accordingly to a selection signal YSEL, so as to write data into the bit cell BC on a target column in the subarray 222.

For example, when a target column of the write operation is the $1^{st}$ column in the subarray 222, the selection circuit 244 is configured to couple the bit line BLd and the complement bit line BLBd in the local input/output circuit 240 to the bit line BL1d and the complement bit line BLB1d on the $1^{st}$ column in the subarray 222 of the memory array 220, so as to write data into the bit cell BC on the $1^{st}$ column in the subarray 222.

During a write operation to the subarray 224, the read/write circuit 246 is configured to generate a write signal and a complement write signal onto a bit line pair, which includes a bit line BLu and a complement bit line BLBu in the local input/output circuit 240. As shown in FIG. 6, the memory array 220 further includes some flying bit line pairs, which are configured to connect the bit line pairs in the subarray 224 on the top side with the selection circuit 244 and the read/write circuit 246 located under the bottom side of the memory array 220.

For example, when a target column of the write operation is the $1^{st}$ column in the subarray 224, the selection circuit 244 is configured to couple the bit line BLu and the complement bit line BLBu in the local input/output circuit 240 to the bit line BL1u and a complement bit line BLB1u on the $1^{st}$ column in the subarray 224 of the memory array 220, via the flying bit line BL1f and the complement flying bit line BLB1f, so as to write data into the bit cell BC on the $1^{st}$ column in the subarray 224.

There are a lot of the rows in the memory array, such that a resistance-capacitance loading on the bit line pair connected with the bit cells on the whole column is relatively large. By dividing the memory array 220 into two subarrays 222 and 224, the resistance-capacitance loading on one bit line pair (e.g., BL1d and BLB1d; BL1u and BLB1u) can be reduced. As shown in embodiments of FIG. 6, each bit line pair in the memory arrays are connected to about a half of bit cells on the same column, such that the resistance-capacitance loading on each bit line pair can be reduced by about 50% (compared with connecting to all bit cells on the same column).

It is noticed that there are three bit line pairs corresponding to the $1^{st}$ column of the memory array 220. These three bit line pairs include a first bit line pair (e.g., the bit line BL1d and the complement bit line BLB1d) connected the bit cells BC in the subarray 222 to the selection circuit 244 and the read/write circuit 246, a second bit line pair (e.g., the bit line BL1u and the complement bit line BLB1u) connected the bit cells BC in the subarray 224, and a third bit line pair (e.g., the flying bit line BL1f and the complement bit line BLB1f) connected from the second bit line pair to the selection circuit 244 and the read/write circuit 246. Similarly, there are another three bit line pairs corresponding to the $n^{th}$ column of the memory array 220.

As illustratively shown in FIG. 6, the modulation circuit 242a is coupled with the bit line BL1d and the complement bit line BLB1d (i.e., the first bit line pair) connected the bit cells BC on the $1^{st}$ column in the subarray 222. The modulation circuit 242a is configured to modulate voltage levels on the bit line BL1d and the complement bit line BLB1d in the subarray 222 according to the control signal BLEQBd.

The modulation circuit 243a is coupled to the bit line BL1u and the complement bit line BLB1u in the subarray 224 (i.e., the second bit line pair) through the flying bit line BL1f and the complement bit line BLB1f (i.e., the third bit line pair). The modulation circuit 243a is configured to modulate voltage levels on the bit line BL1u and the complement bit line BLB1u in the subarray 224 according to the control signal BLEQBu.

Outside a write operation or a read operation, in some embodiments, the modulation circuit 242a is triggered by the control signal BLEQBd and configured to couple the bit line BL1d and the complement bit line BLB1d together with each other, so as to equalize the voltage levels on the bit line BL1d and the complement bit line BLB1d. In some embodiments, outside the write operation or the read operation, the modulation circuit 242a is also configured to precharge the voltage levels on the bit line BL1d and the complement bit line BLB1d to a fixed level, such as the high reference voltage level VDD.

Outside a write operation or a read operation, in some embodiments, the modulation circuit 243a is triggered by the control signal BLEQBu and configured to couple the bit line BL1u and the complement bit line BLB1u together with each other, so as to equalize the voltage levels on the bit line BL1u and the complement bit line BLB1u. In some embodiments, outside the write operation or the read operation, the modulation circuit 243a is also configured to precharge the voltage levels on the bit line BL1u and the complement bit line BLB1u to a fixed level, such as the high reference voltage level VDD. Functions and behaviors of the modulation circuits 242a and 243a can be referred to the modulation circuit 142a in the embodiments discussed in FIG. 2.

Similarly, the modulation circuit 242b is configured to modulate voltage levels on the bit line BLnd and the complement bit line BLBnd in the subarray 222 according to the control signal BLEQBd, and the modulation circuit 243b is configured to modulate voltage levels on the bit line BLnu and the complement bit line BLBnu in the subarray 224 according to the control signal BLEQBu.

In some embodiments, the word line decoder 280 is controlled by the control signal DEC generated by the control signal generator 262. In some embodiments, the word line decoder 280 includes several decoder units 282, and each of the decoder units 282 is configured to provide one word line signal to one of the word lines WL1~WL2k. The control signal DEC is used to control functions of addressing and gating on the decoder units 282 in the word line decoder 280. When the control signal DEC is transmitted from the side of the control signal generator 262 to the decoder units 282 in the word line decoder 280, the control signal DEC arrives different decoder units 282 at different time points. Because aforesaid different arrival timings of the control signal DEC, the word line signals generated by the decoder units 282 in the word line decoder 280 to the word lines WL1~WL2k have pulses with different timings.

In some embodiments, the control signal generator 262 is configured to generate the control signal BLEQBd in reference with a full depth distance DPf between the word line WL1 and the word line WL2k, and also generate the control signal BLEQBu in reference with a half depth distance DPh between the word line WL1 and the word line WLk.

Figure 7:
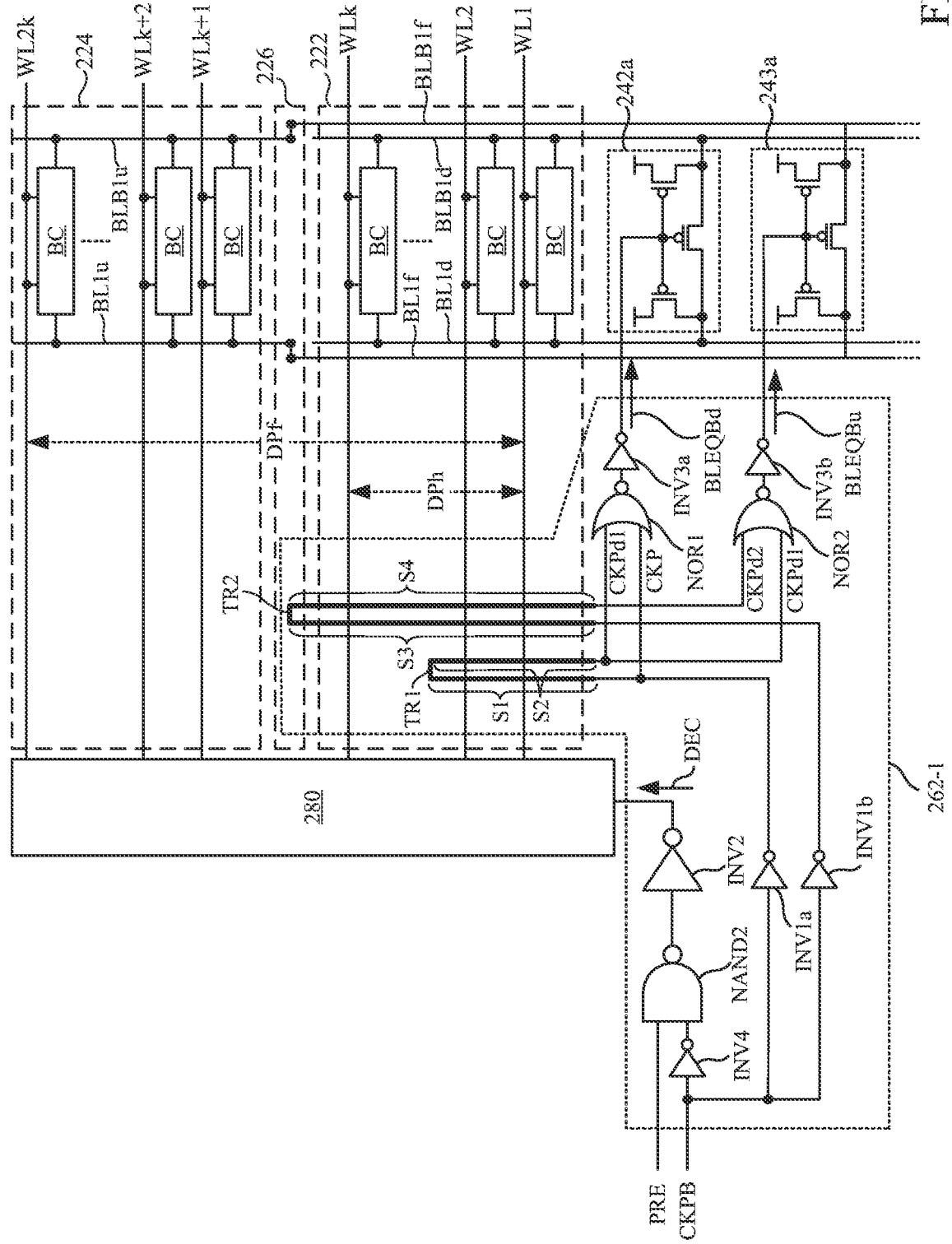
FIG. 7 is a schematic diagram illustrating internal structures of the modulation circuits and the control signal generator in FIG. 6 in accordance with various embodiments of the present disclosure.
Figure 8:
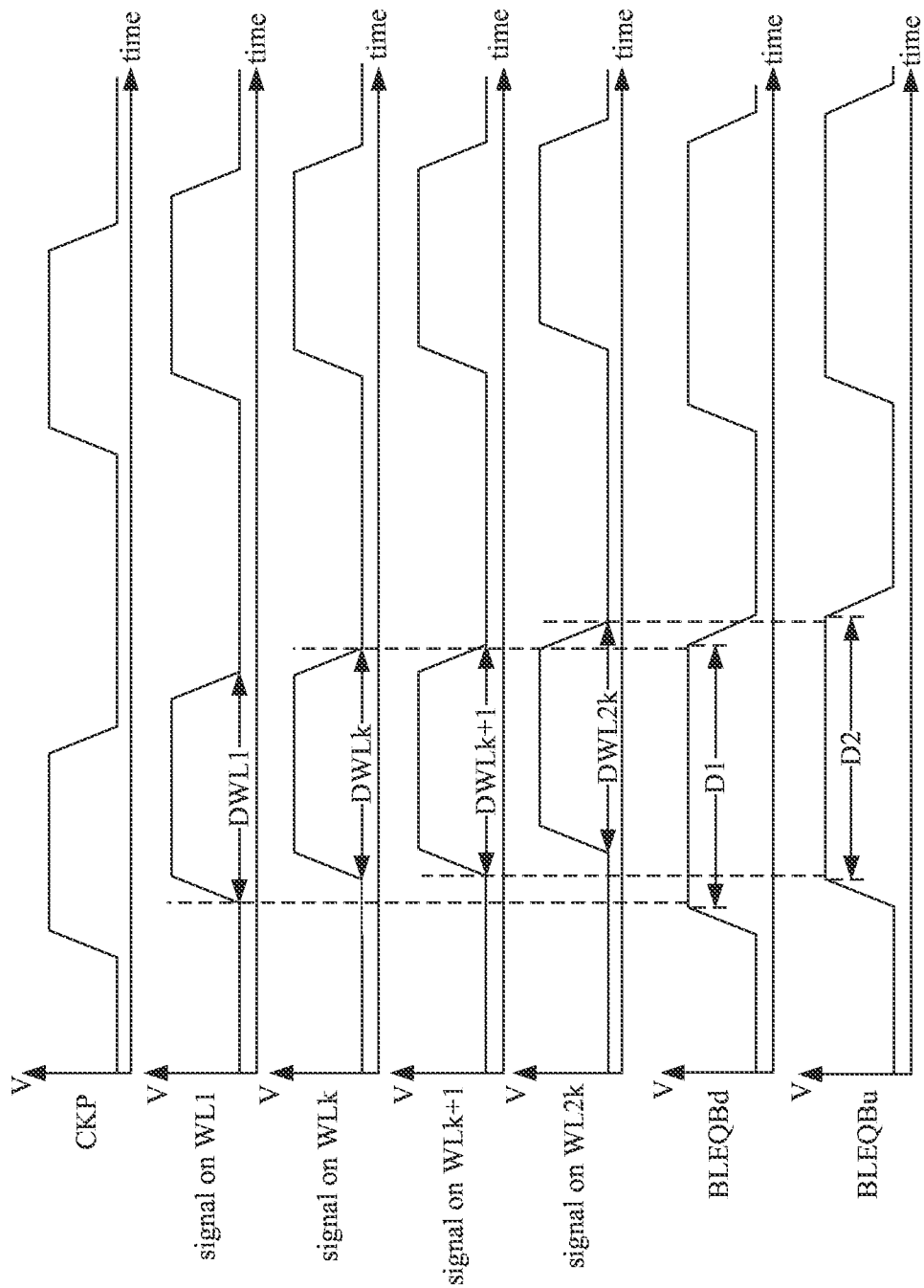
FIG. 8 is a signal waveform illustrating related signals generated in the memory device in FIG. 6 and FIG. 7 in accordance with various embodiments of the present disclosure.

Reference is further made to FIG. 7 and FIG. 8. FIG. 7 is a schematic diagram illustrating internal structures of the modulation circuits and the control signal generator in FIG. 6 in accordance with various embodiments of the present disclosure. FIG. 8 is a signal waveform illustrating related signals generated in the memory device 200 in FIG. 6 and FIG. 7 in accordance with various embodiments of the present disclosure. With respect to the embodiments of FIG. 6, like elements in FIG. 7 and FIG. 8 are designated with the same reference numbers for ease of understanding. It is noticed that, for brevity, FIG. 7 illustrates structures related to the 1$^{st}$ column of the subarray 222 and the subarray 224. Structures related to other columns are similar and can be understood through the embodiments shown in FIG. 7. The control signal generator 262-1 illustratively shown in FIG. 7 is one embodiment of the control signal generator 262 shown in FIG. 6.

As illustratively shown in FIG. 7, the modulation circuit 242a includes three transistors. The gates of the transistors in the modulation circuit 242a are controlled by the control signal BLEQBd. The transistors in the modulation circuit 242a are coupled to the bit line BL1d and the complement bit line BLB1d in the subarray 222. When the control signal BLEQBd is at a low voltage level (e.g., 0V, GND level, or VSS level), the modulation circuit 242a is configured to couple the bit line BL1d and the complement bit line BLB1d (of the bit line pair on the 1$^{st}$ column in the subarray 222) together with each other, so as to equalize the voltage levels on the bit line BL1d and the complement bit line BLB1d. When the control signal BLEQBd is at the low voltage level (e.g., 0V), the modulation circuit 242a is also configured to connect the bit line BL1d and the complement bit line BLB1d to the high reference voltage level VDD, so as to fix the voltage level on bit line BL1d and the complement bit line BLB1d at the high reference voltage level VDD. Behaviors and details about the modulation circuit 242a is similar to the modulation circuit 142a discussed in aforesaid embodiments along with FIG. 2.

In some embodiments, outside the write operation or the read operation, the modulation circuit 242a is configured to precharge the voltage levels on the bit line BL1d and the complement bit line BLB1d to a fixed level, such as the high reference voltage level VDD. In this case, the bit line BL1d and the complement bit line BLB1d are configured at the fixed level instead of being in floating levels, and it can secure the data stored in the bit cell BC and avoid these data to be affected by unexpected floating levels on the bit line BL1d and the complement bit line BLB1d.

Similarly, the modulation circuit 243a includes another three transistors. The gates of the transistors in the modulation circuit 243a are controlled by the control signal BLEQBu. When the control signal BLEQBu is at a low voltage level (e.g., 0V, GND level, or VSS level), the modulation circuit 243a is configured to couple the bit line BL1u (via the flying bit line BL1f) and the complement bit line BLB1u (via the complement flying bit line BLB1f) together with each other, so as to equalize the voltage levels on the bit line BL1u and the complement bit line BLB1u. When the control signal BLEQBu is at the low voltage level (e.g., 0V), the modulation circuit 243a is also configured to connect the bit line BL1u (via the flying bit line BL1f) and the complement bit line BLB1u (via the complement flying bit line BLB1f) to the high reference voltage level VDD, so as to fix the voltage level on bit line BL1u and the complement bit line BLB1u at the high reference voltage level VDD.

Similarly, outside the write operation or the read operation, the modulation circuit 243a is configured to precharge the voltage levels on the bit line BL1u and the complement bit line BLB1u to a fixed level, such as the high reference voltage level VDD. In this case, the modulation circuit 243a is able to avoid data stored in the corresponding bit cells BC to be affected by unexpected floating levels on the bit line BL1u and the complement bit line BLB1u.

When the control signal BLEQBd is at a high voltage level (e.g., VDD level), the modulation circuit 242a is deactivated, and the voltage levels on the bit line BL1d and the complement bit line BLB1d are released from the modulation circuit 242a and controlled by the read/write circuit 246 shown in FIG. 6.

As illustratively shown in FIG. 7 and FIG. 8, during a time duration DWL1, the word line signal to the word line WL1 is switched to the high voltage level, the bit cell BC connected with the word line WL1 shall be ready to read/write, such that a rising edge of the control signal BLEQBd is required to arrive at the same time as (or before) a rising edge of the word line signal on the word line WL1. If the rising edge of the control signal BLEQBd arrives later than the rising edge of the word line signal on the word line WL1, the modulation circuit 242a may not release the bit line BL1d and the complement bit line BLB1d in time, such that a read/write margin to the bit cell BC will be degraded.

As illustratively shown in FIG. 7 and FIG. 8, during a time duration DWLk, the word line signal to the word line WLk is switched to the high voltage level, the bit cell BC connected with the word line WLk shall be ready to read/write, such that a falling edge of the control signal BLEQBd is required to arrive at the same time as (or after) a falling edge of the word line signal on the word line WLk. If the falling edge of the control signal BLEQBd arrives before the falling edge of the word line signal on the word line WLk, the modulation circuit 242a may boost both of the voltage levels on the bit line BL1d and the complement bit line BLB1d to the high voltage levels while the word line WLk still activating an access to the bit cell BC, such that the data bit stored in the bit cell BC may be damaged due to the wrong configuration of the voltage levels on the bit line BL1d and the complement bit line BLB1d.

In other words, the time duration D1 of the control signal BLEQBd switching to the high voltage level is required to enclose the rising edge of the word line signal on the word line WL1 and the falling edge of the word line signal on the word line WLk. In some embodiments, the control signal generator 262-1 is able to generate the control signal BLEQBd at the correct timing with reference to the half depth distance DPh.

For similar reasons, the time duration D2 of the control signal BLEQBu switching to the high voltage level is required to enclose the rising edge of the word line signal on the word line WLk+1 and the falling edge of the word line signal on the word line WL2k. In some embodiments, the control signal generator 262-1 is able to generate the control signal BLEQBu at the correct timing with reference to the half depth distance DPh and the full depth distance DPf.

As shown in FIG. 7, the control signal generator 262-1 in some embodiments includes two tracking wirings TR1 and TR2, three logic gates NOR1, NOR2 and NAND2 and six inverters INV1a, INV1b, INV2, INV3a, INV3b and INV4. In some embodiments, the control signal generator 262-1 includes two sets of logic gates NOR1 and NOR2 coupled with two sets of tracking wirings TR1 and TR2.

In some embodiments, the control signal generator 262-1 receives an input control signal PRE and an inverted input clock signal CKPB. In some embodiments, the logic gate NOR1 and the inverter INV3a is configured to generate the control signal BLEQBd, transmitted to the modulation circuit 242a corresponding to the subarray 222, according to an input clock signal CKP and a first delayed clock signal CKPd1. Behaviors and functions of the logic gate NOR1 and the inverter INV3a in the control signal generator 262-1 shown in FIG. 7 are similar to the logic gate NOR1 and the inverter INV3 in the control signal generator 162-1 shown in FIG. 5. A relationship between the inputs of the logic gate NOR1 and the output of the inverter INV3a is shown in Table 3.

TABLE 3

| first input terminal (CKP) | second input terminal (CKPd1) | output terminal of inverter INV3a (BLEQBd) |
| --- | --- | --- |
| L | L | L |
| L | H | H |
| H | L | H |
| H | H | H |

In some embodiments, the logic gate NOR2 and the inverter INV3b is configured to generate the control signal BLEQBu, transmitted to the modulation circuit 243a corresponding to the subarray 224, according to the first delayed clock signal CKP and a second delayed clock signal CKPd2. Behaviors and functions of the logic gate NOR2 and the inverter INV3b in the control signal generator 262-1 shown in FIG. 7 are similar to the logic gate NOR1 and the inverter INV3 in the control signal generator 162-1 shown in FIG. 5. A relationship between the inputs of the logic gate NOR2 and the output of the inverter INV3b is shown in Table 4.

| first input terminal (CKPd1) | second input terminal (CKPd2) | output terminal of inverter INV3a (BLEQBu) |
| --- | --- | --- |
| L | L | L |
| L | H | H |
| H | L | H |
| H | H | H |

As shown in embodiments in FIG. 7 and FIG. 8, the first delayed clock signal CKPd1 is generated by delaying the input clock signal CKP with the tracking wiring TR1. The tracking wiring TR1 has a tracking length positively correlated with a half depth distance DPh of the word lines WL1~WL2k of the whole memory array 220. In other words, the half depth distance DPh is about a full depth distance of the word lines WL1~WLk of the subarray 222. As shown in FIG. 7, in some embodiments, the tracking wiring TR1 includes a first tracking segment S1 and a second tracking segment S2. The first tracking segment S1 extends from a bottom side edge of the word lines WL1~WL2k toward a quarter position of the word lines WL1~WL2k. For example, when there are total 2048 word lines (k=1024) in the whole memory array 220, the first tracking segment S1 extends from the word line WL1 to the $512^{th}$ word line (not shown in figures). The second tracking segment S2 extends from the quarter position of the word lines WL1~WL2k toward the bottom side edge of the word lines WL1~WL2k. In this case, the sum of lengths of the first tracking segment S1 and the second tracking segment S2 is similar or approximately equal to the half depth distance DPh. The half depth distance DPh can be regarded as the full depth distance of the word lines WL1~WLk of the subarray 222.

A rising edge of the control signal BLEQBd generated by the inverter INV3a and the logic gate NOR1 in FIG. 7 and FIG. 8 is triggered by a rising edge of the input clock signal CKP. With the help of the tracking wiring TR to track the delay about the half depth distance DPh, a falling edge of the control signal BLEQBd generated by the inverter INV3a and the logic gate NOR1 in FIG. 7 is triggered by a falling edge of the first delayed clock signal CKPd1, which is equal to the input clock signal CKP after being delayed by the tracking wiring TR1. In this case, as shown in FIG. 8, the time duration D1 of the control signal BLEQBd switching to the high voltage level is able to enclose the rising edge of the word line signal on the word line WL1 and the falling edge of the word line signal on the word line WLk.

As shown in embodiments in FIG. 7 and FIG. 8, the second delayed clock signal CKPd2 is generated by delaying the input clock signal CKP with the tracking wiring TR2. The tracking wiring TR2 has a tracking length positively correlated with a full depth distance DPh of the word lines WL1~WL2k of the whole memory array 220. As shown in FIG. 7, in some embodiments, the tracking wiring TR2 includes a third tracking segment S3 and a fourth tracking segment S4. The third tracking segment S3 extends from a bottom side edge of the word lines WL1~WL2k toward a half position of the word lines WL1~WL2k. For example, when there are total 2048 word lines (k=1024) in the whole memory array 220, the first tracking segment S3 extends from the $1^{st}$ word line WL1 to the $1024^{th}$ word line WLk. The fourth tracking segment S4 extends from the half position of the word lines WL1~WL2k toward the bottom side edge of the word lines WL1~WL2k. In this case, the sum of lengths of the third tracking segment S3 and the fourth tracking segment S4 is similar or approximately equal to the full depth distance DPf.

A rising edge of the control signal BLEQBu generated by the inverter INV3b and the logic gate NOR2 in FIG. 7 and FIG. 8 is triggered by a rising edge of the the first delayed clock signal CKPd1. With the help of the tracking wiring TR2 to track the delay about the half depth distance DPf, a falling edge of the control signal BLEQBu generated by the inverter INV3b and the logic gate NOR2 in FIG. 7 is triggered by a falling edge of the second delayed clock signal CKPd2, which is equal to the input clock signal CKP after being delayed by the tracking wiring TR2. In this case, as shown in FIG. 8, the time duration D2 of the control signal BLEQBu switching to the high voltage level is able to enclose the rising edge of the word line signal on the word line WLk+1 and the falling edge of the word line signal on the word line WL2k.

In embodiments discussed above, the control signal BLEQBd generated by the control signal generator 262-1 is determined according to the depth distance of the subarray 222, such that the control signal BLEQBd is switched to the high voltage level in time before (or at the same time) the word line WL1 is set to the high voltage level, the control signal BLEQBd is hold at the high voltage level long enough until the word line WLk is set to the low voltage level. On the other hand, the control signal BLEQBu generated by the control signal generator 262-1 is determined according to the depth distance of the subarray 224, such that the control signal BLEQBu is switched to the high voltage level in time before (or at the same time) the word line WLk+1 is set to the high voltage level, the control signal BLEQBu is hold at the high voltage level long enough until the word line WL2k is set to the low voltage level.

It is noticed that the control signal generator 262-1 illustratively shown in FIG. 7 is one exemplary embodiment to achieve the control signal generator 262 shown in FIG. 6. The logic functions of the logic gates NOR1 and NOR2 in the control signal generator 262-1 are similar to the embodiments of the logic gate NOR1 of the control signal generator 162-3 shown in FIG. 5. However, the disclosure is not limited thereto. In some other embodiments, the control signal generator 262 in FIG. 6 can be achieved with other equivalent structures, for example, each of the logic gates NOR1 and NOR2 in the control signal generator 262-1 can be replaced by structures of the logic gate NAND1 of the control signal generator 162-1 shown in FIG. 2, or replaced by structures of the logic gate NOR1 of the control signal generator 162-2 shown in FIG. 4.

In some embodiments, a device includes a memory array, a plurality of bit line pairs, a plurality of word lines, a modulation circuit and a control signal generator. The memory array has a plurality of bit cells arranged in rows and columns. Each bit line pair is connected to a respective column of bit cells. Each word line is connected to a respective row of bit cells. The modulation circuit is coupled with at least one bit line pair. The control signal generator is coupled with the modulation circuit. The control signal generator includes a tracking wiring with a tracking length positively correlated with a depth distance of the word lines. The control signal generator is configured to produce a control signal, switching to a first voltage level for a first time duration in reference with the tracking length, for controlling the modulation circuit.

In some embodiments, in response to the control signal at a second voltage level different from the first voltage level, the modulation circuit is configured to connect a bit line and a complement bit line in the at least one bit line pair with each other to equalize voltage levels on the bit line and the complement bit line.

In some embodiments, in response to the control signal at the first voltage level, the modulation circuit is configured to precharge a bit line and a complement bit line in the at least one bit line pair to a reference voltage level.

In some embodiments, the device further includes a read/write circuit, which is coupled to the at least one bit line pair. In response to the control signal switching to the first voltage level, the modulation circuit is deactivated, and the read/write circuit is configured to access the bit cells connected with the at least one bit line pair.

In some embodiments, the tracking wiring includes a first tracking segment and a second tracking segment. The first tracking segment extends from a side edge of the word lines toward a half position of the word lines. The second tracking segment extends from the half position of the word lines toward the side edge of the word lines. A sum of lengths of the first tracking segment and the second tracking segment is positively correlated with the depth distance of the word lines.

In some embodiments, the control signal generator includes a logic gate. The logic gate has a first input terminal, a second input terminal and an output terminal. The first input terminal of the logic gate is configured to receive a clock signal. The second input terminal of the logic gate is configured to receive the clock signal after being delayed through the tracking wiring. The output terminal is configured to produce the control signal.

In some embodiments, a device includes a memory array, a first bit line pair, a second bit line pair, a plurality of word lines, a first modulation circuit, a second modulation circuit and a control signal generator. The memory array has a plurality of bit cells arranged in rows and columns. The memory array includes a first subarray of bit cells and a second subarray of bit cells. The first bit line pair is coupled to bit cells in the first subarray on a column of the memory array. The second bit line pair is coupled to bit cells in the second subarray on the column of the memory array. The plurality of word lines extend along a plurality of rows of the memory array. The first modulation circuit is coupled with the first bit line pair. The second modulation circuit is coupled with the second bit line pair. The control signal generator is coupled with the first modulation circuit and the second modulation circuit. The control signal generator includes a first tracking wiring with a first tracking length positively correlated with a half depth distance of the word lines. The control signal generator is configured to produce a first control signal, switching to a first voltage level for a first time duration in reference with the first tracking length, for controlling the first modulation circuit. The control signal generator includes a second tracking wiring with a second tracking length positively correlated with a full depth distance of the word lines, the control signal generator is configured to produce a second control signal, switching to the first voltage level for a second time duration in reference with the second tracking length, for controlling the second modulation circuit.

In some embodiments, the first bit line pair is configured to extend along the column of the memory array, from a first side edge of the memory array, and terminating between the first subarray and the second subarray. The first bit line pair is coupled to bit cells of the first subarray in the column.

In some embodiments, the second bit line pair is configured to extend from a strap cell between the first subarray and the second subarray, along the column of the memory array, to a second side edge of the memory array, the second bit line pair being coupled to bit cells of the second subarray in the column.

In some embodiments, the device further includes a third bit line pair coupled between the second modulation circuit and the second bit line pair. The third bit line pair extends along the column of the memory array and in parallel with the first bit line pair.

In some embodiments, in response to the first control signal at a second voltage level different from the first voltage level, the first modulation circuit is configured to connect a bit line and a complement bit line in the first bit line pair with each other and to precharge the bit line and the complement bit line in the first bit line pair to a reference voltage level.

In some embodiments, in response to the second control signal at a second voltage level different from the first voltage level, the second modulation circuit is configured to connect a bit line and a complement bit line in the second bit line pair with each other and to precharge the bit line and the complement bit line in the second bit line pair to a reference voltage level.

In some embodiments, the device includes a read/write circuit coupled to the first bit line pair and the second bit line pair. In response to the first control signal and the second control signal switching to the first voltage level, the first modulation circuit and the second modulation circuit are deactivated, and the read/write circuit is configured to access the bit cells connected with the first bit line pair or the second bit line pair.

In some embodiments, the first tracking wiring includes a first tracking segment and a second tracking segment. The first tracking segment extends from a side edge of the word lines toward a quarter position of the word lines. The second tracking segment extends from the quarter position of the word lines toward the side edge of the word lines. A sum of lengths of the first tracking segment and the second tracking segment is positively correlated with the half depth distance of the word lines.

In some embodiments, the second tracking wiring includes a third tracking segment and a fourth tracking segment. The third tracking segment extends from a side edge of the word lines toward a center of the word lines. The fourth tracking segment extends from the half position of the word lines toward the side edge of the word lines. A sum of lengths of the third tracking segment and the fourth tracking segment is positively correlated with the full depth distance of the word lines.

In some embodiments, the control signal generator includes a first logic gate having a first input terminal, a second input terminal and an output terminal. The first input terminal of the first logic gate is configured to receive a clock signal. The second input terminal of the first logic gate is configured to receive the clock signal after being delayed through the first tracking wiring, and the output terminal being configured to produce the first control signal.

In some embodiments, the control signal generator includes a second logic gate having a first input terminal, a second input terminal and an output terminal. The first input terminal of the second logic gate is configured to receive the clock signal after being delayed through the first tracking wiring. The second input terminal of the second logic gate is configured to receive the clock signal after being delayed through the second tracking wiring. The output terminal of the second logic gate is configured to produce the second control signal.

In some embodiments, the first subarray is disposed relatively adjacent to a side edge of the memory array, and the second subarray disposed relatively away from the side edge.

In some embodiments, a method includes following operations. A clock signal is delayed into a first delayed clock signal with a first tracking wiring. The first tracking wiring has a first tracking length positively correlated with a first depth distance of word lines. A first control signal is generated in reference with the clock signal and the first delayed clock signal.

In some embodiments, the method further include following operations. The clock signal is delayed into a second delayed clock signal with a second tracking wiring. The second tracking wiring has a second tracking length positively correlated with a second depth distance of word lines. A second control signal is generated in reference with the first delayed clock signal and the second delayed clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a memory array having a plurality of bit cells arranged in rows and columns;
    a plurality of bit line pairs, each bit line pair connected to a respective column of bit cells;
    a plurality of word lines, each word line connected to a respective row of bit cells;
    a modulation circuit coupled with at least one bit line pair; and
    a control signal generator coupled with the modulation circuit, wherein the control signal generator comprises a tracking wiring with a tracking length positively correlated with a depth distance of the word lines, the control signal generator is configured to produce a control signal, switching to a first voltage level for a first time duration in reference with the tracking length, for controlling the modulation circuit.

2. The device of claim 1, wherein, in response to the control signal at a second voltage level different from the first voltage level, the modulation circuit is configured to connect a bit line and a complement bit line in the at least one bit line pair with each other to equalize voltage levels on the bit line and the complement bit line.

3. The device of claim 1, wherein, in response to the control signal at the first voltage level, the modulation circuit is configured to precharge a bit line and a complement bit line in the at least one bit line pair to a reference voltage level.

4. The device of claim 1, further comprises:
    a read/write circuit coupled to the at least one bit line pair, wherein, in response to the control signal switching to the first voltage level, the modulation circuit is deactivated, and the read/write circuit is configured to access the bit cells connected with the at least one bit line pair.

5. The device of claim 1, wherein the tracking wiring comprises:
    a first tracking segment, extending from a side edge of the word lines toward a half position of the word lines; and
    a second tracking segment, extending from the half position of the word lines toward the side edge of the word lines, a sum of lengths of the first tracking segment and the second tracking segment is positively correlated with the depth distance of the word lines.

6. The device of claim 1, wherein the control signal generator comprises:
    a logic gate, having a first input terminal, a second input terminal and an output terminal, the first input terminal of the logic gate being configured to receive a clock signal, the second input terminal of the logic gate being configured to receive the clock signal after being delayed through the tracking wiring, and the output terminal being configured to produce the control signal.

7. A device, comprising:
a memory array having a plurality of bit cells arranged in rows and columns, wherein the memory array comprises a first subarray of bit cells and a second subarray of bit cells;
a first bit line pair, coupled to bit cells in the first subarray on a column of the memory array;
a second bit line pair, coupled to bit cells in the second subarray on the column of the memory array;
a plurality of word lines, extending along a plurality of rows of the memory array;
a first modulation circuit coupled with the first bit line pair;
a second modulation circuit coupled with the second bit line pair; and
a control signal generator coupled with the first modulation circuit and the second modulation circuit,
wherein the control signal generator comprises a first tracking wiring with a first tracking length positively correlated with a half depth distance of the word lines, the control signal generator is configured to produce a first control signal, switching to a first voltage level for a first time duration in reference with the first tracking length, for controlling the first modulation circuit, and
wherein the control signal generator comprises a second tracking wiring with a second tracking length positively correlated with a full depth distance of the word lines, the control signal generator is configured to produce a second control signal, switching to the first voltage level for a second time duration in reference with the full tracking length, for controlling the second modulation circuit.

8. The device of claim 7, wherein the first bit line pair is configured to extend along the column of the memory array, from a first side edge of the memory array, and terminating between the first subarray and the second subarray, the first bit line pair is coupled to bit cells of the first subarray in the column.

9. The device of claim 8, wherein the second bit line pair is configured to extend from a strap cell between the first subarray and the second subarray, along the column of the memory array, to a second side edge of the memory array, the second bit line pair is coupled to bit cells of the second subarray in the column.

10. The device of claim 9, further comprising:
a third bit line pair, coupled between the second modulation circuit and the second bit line pair, wherein the third bit line pair extends along the column of the memory array and in parallel with the first bit line pair.

11. The device of claim 7, wherein, in response to the first control signal at a second voltage level different from the first voltage level, the first modulation circuit is configured to connect a bit line and a complement bit line in the first bit line pair with each other and to precharge the bit line and the complement bit line in the first bit line pair to a reference voltage level.

12. The device of claim 7, wherein, in response to the second control signal at a second voltage level different from the first voltage level, the second modulation circuit is configured to connect a bit line and a complement bit line in the second bit line pair with each other and to precharge the bit line and the complement bit line in the second bit line pair to a reference voltage level.

13. The device of claim 7, further comprises:

a read/write circuit coupled to the first bit line pair and the second bit line pair, wherein, in response to the first control signal and the second control signal switching to the first voltage level, the first modulation circuit and the second modulation circuit are deactivated, and the read/write circuit is configured to access the bit cells connected with the first bit line pair or the second bit line pair.

14. The device of claim 7, wherein the first tracking wiring comprises:
a first tracking segment, extending from a side edge of the word lines toward a quarter position of the word lines; and
a second tracking segment, extending from the quarter position of the word lines toward the side edge of the word lines, a sum of lengths of the first tracking segment and the second tracking segment is positively correlated with the half depth distance of the word lines.

15. The device of claim 7, wherein the second tracking wiring comprises:
a third tracking segment, extending from a side edge of the word lines toward a center of the word lines; and
a fourth tracking segment, extending from the half position of the word lines toward the side edge of the word lines, a sum of lengths of the third tracking segment and the fourth tracking segment is positively correlated with the full depth distance of the word lines.

16. The device of claim 7, wherein the control signal generator comprises:
a first logic gate, having a first input terminal, a second input terminal and an output terminal, the first input terminal of the first logic gate being configured to receive a clock signal, the second input terminal of the first logic gate being configured to receive the clock signal after being delayed through the first tracking wiring, and the output terminal being configured to produce the first control signal.

17. The device of claim 16, wherein the control signal generator comprises:
a second logic gate, having a first input terminal, a second input terminal and an output terminal, the first input terminal of the second logic gate being configured to receive the clock signal after being delayed through the first tracking wiring, the second input terminal of the second logic gate being configured to receive the clock signal after being delayed through the second tracking wiring, and the output terminal of the second logic gate being configured to produce the second control signal.

18. The device of claim 16, wherein the first subarray is disposed relatively adjacent to a side edge of the memory array, and the second subarray disposed relatively away from the side edge.

19. A method, comprising:
delaying a clock signal into a first delayed clock signal with a first tracking wiring, the first tracking wiring having a first tracking length positively correlated with a first depth distance of word lines; and
generating a first control signal, by a first logic gate, in reference with the clock signal and the first delayed clock signal.

20. The method of claim 19, further comprising:
delaying the clock signal into a second delayed clock signal with a second tracking wiring, the second tracking wiring having a second tracking length positively correlated with a second depth distance of word lines; and generating a second control signal, by a second logic gate, in reference with the first delayed clock signal and the second delayed clock signal.

* * * * *